United States Patent [19]

Schönberger et al.

[11] Patent Number: 5,461,201
[45] Date of Patent: Oct. 24, 1995

[54] INSULATING PART WITH INTEGRAL COOLING ELEMENT

[75] Inventors: Eduard Schönberger; Stefan Gruber, both of Kümmersbruck; Hermann Kasowski, Kastl; Heinz Schmidt, Kümmersbruck, all of Germany

[73] Assignee: Siemens Aktiengesellschaft, München, Germany

[21] Appl. No.: 185,605

[22] Filed: Jan. 21, 1994

[30] Foreign Application Priority Data

Jan. 22, 1993 [DE] Germany ............................. 9300865 U

[51] Int. Cl.⁶ ..................................................... H05K 7/20
[52] U.S. Cl. ...................... 174/16.3; 165/80.3; 174/252; 361/707; 361/709; 361/719; 361/720
[58] Field of Search ................................... 174/16.3, 252; 361/704, 707, 709, 711, 719, 720; 165/80.3, 185

[56] References Cited

U.S. PATENT DOCUMENTS

| | | | |
|---|---|---|---|
| 3,930,114 | 12/1975 | Hodge | 174/16.3 |
| 4,410,927 | 10/1983 | Butt | 174/16.3 |
| 4,698,662 | 10/1987 | Young et al. | 174/16.3 |
| 4,868,349 | 9/1989 | Chia | 174/16.3 |
| 4,879,630 | 11/1989 | Boucard et al. | 174/16.3 |
| 5,285,352 | 2/1994 | Pastore et al. | 174/16.3 |
| 5,293,301 | 3/1994 | Tanaka | 361/707 |
| 5,343,360 | 8/1994 | Sanwo | 361/707 |

FOREIGN PATENT DOCUMENTS

| | | | |
|---|---|---|---|
| 0306412 | 3/1989 | European Pat. Off. . | |
| 0465693 | 1/1992 | European Pat. Off. . | |
| 0465692 | 1/1992 | European Pat. Off. . | |
| 2560731 | 9/1985 | France . | |
| 28831 | 1/1989 | Japan | 174/252 |
| 179298 | 6/1992 | Japan | 174/16.3 |

Primary Examiner—Morris H. Nimmo
Attorney, Agent, or Firm—Kenyon & Kenyon

[57] ABSTRACT

An insulating part for an electronic device includes a body having a metallized outer surface and a heat sink arranged within the body. The heat sink is thermally coupled to an electronic component and to the metallized outer surface, and may also be either electrically coupled or electrically isolated from the electronic component. The insulating part is preferably made of plastic by an injection-molding process, while the heat sink is preferably a metal block integrally formed within the insulating part.

7 Claims, 2 Drawing Sheets

INSULATING PART WITH INTEGRAL COOLING ELEMENT

BACKGROUND OF THE INVENTION

The present invention relates to the field of insulating parts for electronic devices, and in particular to an insulating part having an integral cooling element coupled to one or more electrical components. Such parts are commonly injection-molded from plastic and generally have conductors arranged thereon to electroconductively connect various electronic components. A part of this type is disclosed, for example, by European Patent EP-0 465 693 A1. Parts of this type have a variety of applications; for instance, the part may be used as the rear panel for a housing of a programmable controller, such as in the "SIMATIC S5-95 U" manufactured by "SIEMENS AG."

It is well-known in the art of electronics to use an outer surface of a device as a cooling surface for the electronic components of the device. Manufacturing and design constraints often dictate that such a cooling surface be located at a distance from the components to be cooled. Such a remote arrangement, however, makes it difficult to ensure that the electronic components will be effectively cooled. This problem is solved by the insulating part of the present invention.

SUMMARY OF THE INVENTION

The present invention provides an insulating part with an improved element for cooling electronic components. An embodiment of the insulating part includes a single-piece injection-molded plastic part with a plurality of electronic components arranged therein or thereon, with the electronic components electroconductively connected to one another through conductors arranged on surfaces of the part. The improved cooling ability of the insulating part is provided by a metal block formed within the interior of the part. The metal block is thermally connected to the component or components to be cooled and serves as a heat sink for those components. The metal block is in turn thermally coupled to a cooling surface of the device.

In addition to being thermally coupled to the components to be cooled, the metal block of the present invention may either be electrically isolated or electrically coupled to those components. When electrically isolated, the metal block may safely be coupled to multiple components exhibiting different potentials. On the other hand, having the metal block connected both thermally and electrically to the electronic component ensures particularly effective heat dissipation. Additional features and advantages of the present invention are described below with reference to the exemplary embodiment shown in the drawing figure.

DETAILED DESCRIPTION

Figure 1:
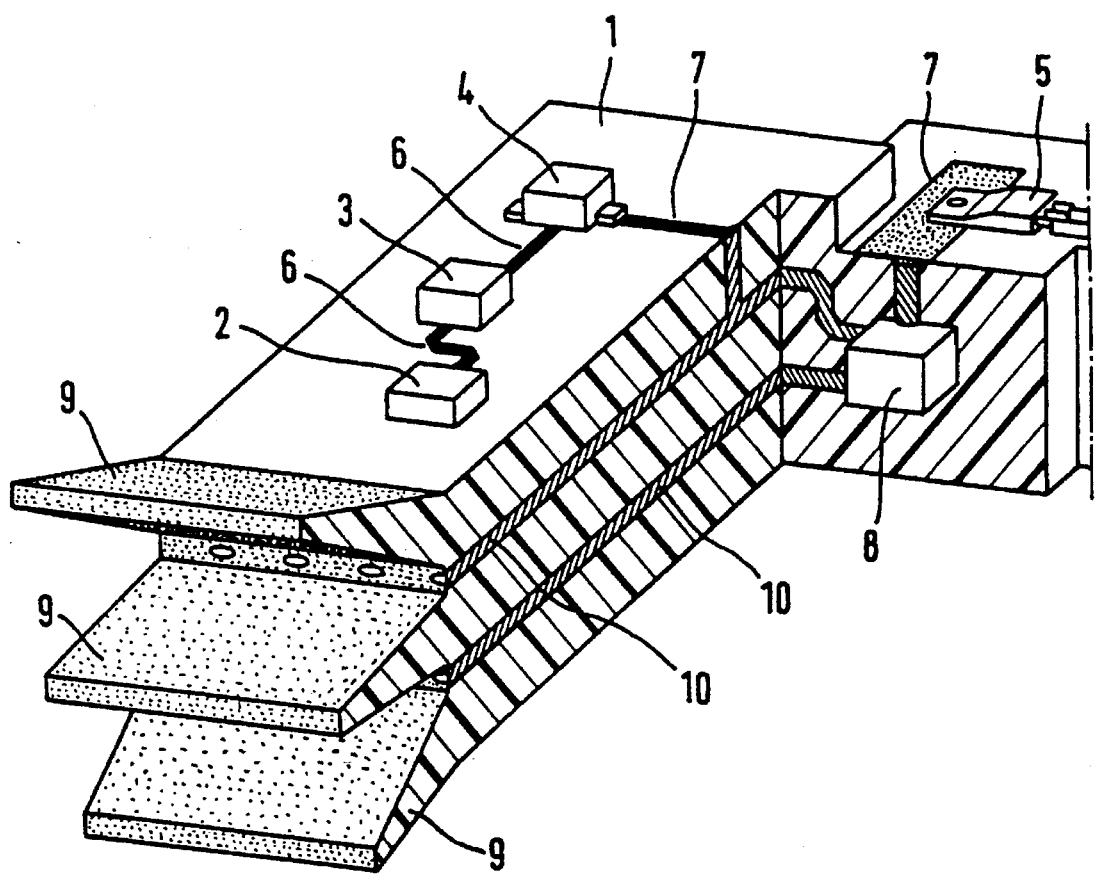
FIGS. 1 and 2 are partially-sectioned perspective views of embodiments of the present invention showing an insulating part with an integral heat sink.

Referring now to FIG. 1, an embodiment of the present invention includes an injection-molded plastic part 1 designed as a circuit substrate fitted with electronic components 2 through 5. These components are electroconductively connected to one another through conductors 6, 7. The conductors 6, 7 may be formed, for example, after the injection molding operation by metallizing the injection-molded plastic part 1 over a large area and then removing the metal layer between the conductors 6, 7.

In the embodiment of FIG. 1, the electronic components 4 and 5 are power-generating elements that must be cooled during operation. According to the present invention, the waste heat from the electronic components 4 and 5 is dissipated through the conductors 7 to the metal block 8. The metal block 8 is arranged in the interior of the injection-molded plastic part 1, and is ideally surrounded on all sides thereby. The metal block 8 may be integrally cast within the injection-molded plastic part 1 using the so-called "insert technique," resulting in the metal block 8 being securely and undetachably held. In this embodiment, the metal block 8 is connected both electrically and thermally to the electronic components 4 and 5, and thus serves as an effective heat sink when those components experience short-term load peaks.

The metal block 8 may also be connected to frame potential, for example, through the conductor 7. The metal block 8 also exhibits frame potential itself; therefore, one would not be endangered by touching the cooling ribs 9 of the injection-molded plastic part 1, which are metallized over a large area of their outer surfaces. The cooling ribs 9 are connected to the metal block 8 through metallized channels 10 arranged in the interior of the injection-molded plastic part 1. Both the cooling ribs 9 and the channels 10 may be coated along with the injection-molded plastic part 1 during the metallization process noted above.

Figure 2:
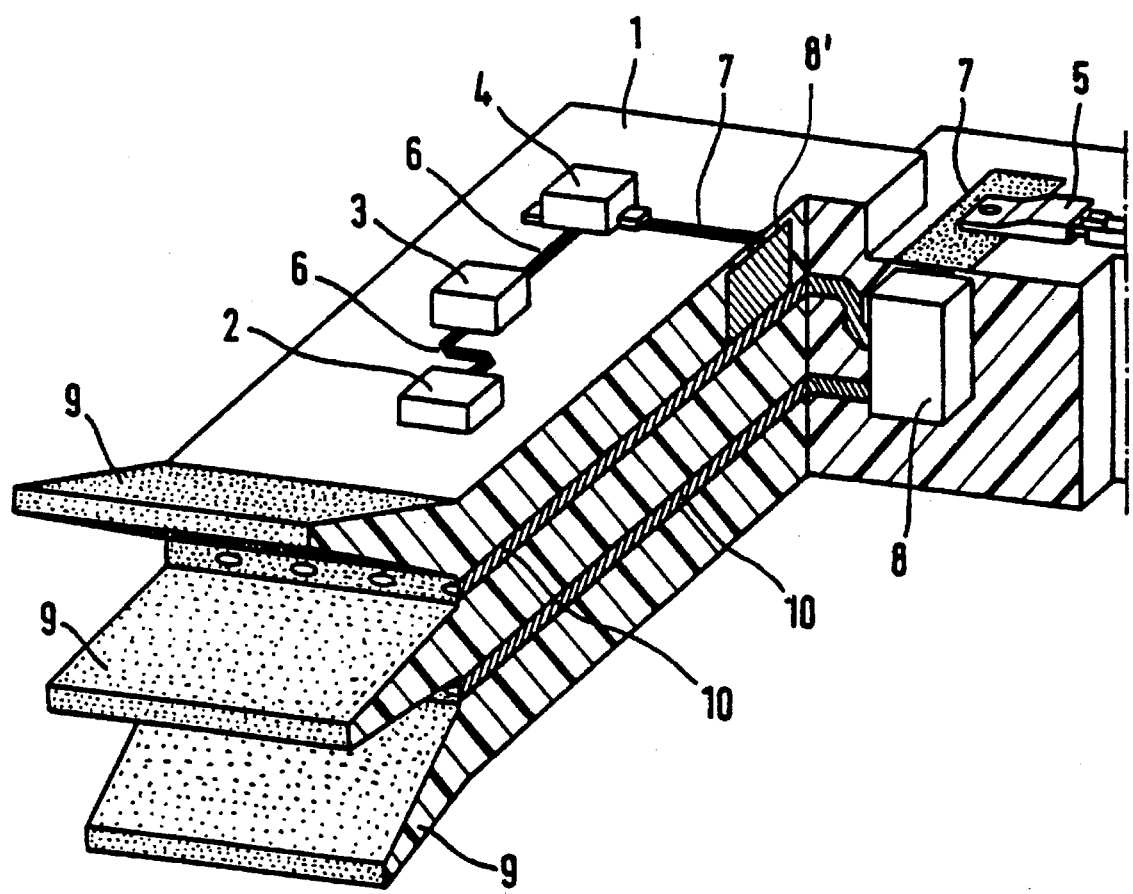

Instead of having both an electrically conductive and a thermally conductive connection between the metal block 8 and the components 4 and 5 of FIG. 1, one skilled in the art will recognize that as shown in FIG. 2 a metal block 8' could bd electrically isolated from the component 4. Such electrical isolation could be provided, for example, by a thin plastic layer approximately 0.3 mm thick arranged between the metal block 8' and the component 4. While providing electrical isolation, a plastic layer of this type would nonetheless permit the component 4 to be thermally coupled to the metal block 8'. In this configuration, the component 4 would not be damaged were one to touch the cooling ribs 9 or the circuitry as a whole arranged in the injection-molded plastic part 1. Moreover, the electrical isolation permits a variety of components having different potentials to be cooled by the same metal block or by a plurality of electroconductively connected metal blocks. Such a configuration would provide a similar cooling ability for a component having a potential that does not correspond to frame potential.

Although the present invention has been described with reference to specific embodiments, it will be apparent to those skilled in the art that many modifications and variations are possible. Accordingly, the present invention embraces all alternatives, modifications and variations that fall within the spirit and scope of the appended claims, as well as all equivalents thereof.

What is claimed is:

1. An insulating part for cooling an electronic component of a device, comprising:

a body on which an electronic component is arranged, said body having a metallized outer surface; and a heat sink, including a metal block, arranged within an interior portion of said body and surrounded by said body on all sides, wherein said heat sink is thermally coupled to the electronic component to be cooled and to said metallized outer surface of said body.

2. The insulating part of claim 1, wherein said body is injection-molded from plastic as a single part.

3. The insulating part of claim 1 wherein said heat sink is electrically isolated from the electronic component to be cooled.

4. The insulating part of claim 1 further comprising an electrically conductive connection between said heat sink and the electronic component to be cooled.

5. An injection-molded plastic part for cooling electronic components of a device, comprising:

a body with a plurality of electronic components arranged therein or thereon, said body having a metallized outer surface and one or more conductors electroconductively connecting the plurality of electronic components; and a heat sink, including a metal block, arranged within an interior portion of said body and surrounded by said body on all sides, wherein said heat sink is thermally coupled to an electronic component to be cooled and to said metallized outer surface of said body, with said thermal coupling to said metallized outer surface provided by a thermally conductive connector arranged within an interior portion of said body.

6. The injection-molded plastic part of claim 8 wherein said heat sink is electrically isolated from the electronic component to be cooled.

7. The injection-molded plastic part of claim 5 further comprising an electrically conductive connection between said heat sink and the electronic component to be cooled.

* * * * *